(12) United States Patent  (10) Patent No.: US 7,579,611 B2
Lam et al.  (45) Date of Patent: Aug. 25, 2009

(54) NONVOLATILE MEMORY CELL COMPRISING A CHALCOGENIDE AND A TRANSITION METAL OXIDE

(75) Inventors: Chung Hon Lam, Peekskill, NY (US); Gerhard Ingmar Meijer, Zurich (CH); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 11/353,419

(22) Filed: Feb. 14, 2006

(65) Prior Publication Data

US 2007/0187829 A1 Aug. 16, 2007

(51) Int. Cl.
*H01L 29/12* (2006.01)
*G11C 11/00* (2006.01)
*G11C 11/56* (2006.01)

(52) U.S. Cl. ............ 257/2; 257/E45.002; 257/E45.003; 365/46; 365/148; 365/186

(58) Field of Classification Search ................. 257/1–5, 257/295, E29.105, E45.001–E45.004; 438/84, 438/102–103; 365/148, 159, 163, 186–188, 365/46
See application file for complete search history.

(56) References Cited

U.S. PATENT DOCUMENTS

| 5,536,947 | A * | 7/1996 | Klersy et al. ............. 257/3 |
| 6,815,744 | B1 * | 11/2004 | Beck et al. .............. 257/295 |
| 6,914,255 | B2 * | 7/2005 | Lowrey ................... 257/5 |
| 6,972,428 | B2 * | 12/2005 | Maimon .................. 257/2 |
| 7,135,696 | B2 * | 11/2006 | Karpov et al. ............ 257/2 |
| 7,414,295 | B2 * | 8/2008 | Cho et al. ............... 257/529 |
| 2003/0146427 | A1 * | 8/2003 | Campbell ................. 257/2 |
| 2003/0219924 | A1 | 11/2003 | Bez et al. |
| 2004/0036065 | A1 | 2/2004 | Doan et al. |
| 2004/0178404 | A1 * | 9/2004 | Ovshinsky ............... 257/4 |
| 2005/0167656 | A1 | 8/2005 | Sun et al. |
| 2005/0285094 | A1 * | 12/2005 | Lee et al. ............... 257/2 |
| 2006/0098472 | A1 * | 5/2006 | Ahn et al. ............... 365/145 |
| 2006/0131554 | A1 * | 6/2006 | Joung et al. ............. 257/2 |
| 2006/0226411 | A1 * | 10/2006 | Lee ..................... 257/2 |
| 2007/0008774 | A1 * | 1/2007 | Khang .................. 365/163 |
| 2007/0096074 | A1 * | 5/2007 | Asano et al. ............. 257/4 |

OTHER PUBLICATIONS

IBM Technical Disclosure NN75053548 (May 1975).*
IBM Technical Disclosure NN72053581 (May 1972).*
C. Rossel et al., "Electrical Current Distribution Across a Metal-Insulator-Metal Structure During Bistable Switching," Journal of Applied Physics, vol. 90, No. 6, pp. 2892-2898, Sep. 2001.

(Continued)

*Primary Examiner*—Douglas M Menz
*Assistant Examiner*—Matthew W Such
(74) *Attorney, Agent, or Firm*—Ryan, Mason & Lewis, LLP

(57) ABSTRACT

A memory cell for use in integrated circuits comprises a chalcogenide feature and a transition metal oxide feature. Both the chalcogenide feature and transition metal oxide feature each have at least two stable electrical resistance states. At least two bits of data can be concurrently stored in the memory cell by placing the chalcogenide feature into one of its stable electrical resistance states and by placing the transition metal oxide feature into one of its stable electrical resistance states.

17 Claims, 5 Drawing Sheets

OTHER PUBLICATIONS

Y. Watanabe et al., "Current-Driven Insulator-Conductor Transition and Nonvolatile Memory in Chromium-Doped $SrTiO_3$ Single Crystals," Applied Physics Letters, vol. 78, No. 23, pp. 3738-3740, Jun. 2001.

A. Beck et al., "Reproducible Switching Effect in Thin Oxide Films for Memory Applications," Applied Physics Letters, vol. 77, No. 1, pp. 139-141, Jul. 2000.

A. Pirovano et al., "Electronic Switching in Phase-Change Memories," IEEE Transactions on Electronic Devices, vol. 51, No. 3, pp. 452-459, Mar. 2004.

A.L. Lacaita et al., "Electrothermal and Phase-Change Dynamics in Chalcogenide-Based Memories," IEEE, 4 pages, 2004.

Y.N. Hwang et al, "Full Integration and Reliability Evaluation of Phase-Change RAM Based on 0.24-um-CMOS Technologies," 2003 Symposium on VLSI Technology Digest Technical Papers, Samsung Electronics, 2 pages, 2003.

H. Horii et al., "A Novel Cell Technology Using N-Doped GeSbTe Films for Phase Change RAM," 2003 Symposium on VLSI Technology Digest of Technical Papers, 2 pages, 2003.

* cited by examiner

CURRENT FLOW

CURRENT FLOW

NONVOLATILE MEMORY CELL COMPRISING A CHALCOGENIDE AND A TRANSITION METAL OXIDE

FIELD OF THE INVENTION

This invention relates generally to integrated circuit memories and, more particularly, to a nonvolatile memory cell for use in integrated circuits.

BACKGROUND OF THE INVENTION

Recently, materials displaying the ability to be reversibly switched between two stable electrical resistance states have been proposed for use in nonvolatile memories. When incorporated in a memory cell, these materials can be toggled between higher and lower electrical resistance states by applying a pulse of electrical current ("switching current pulse") to the materials. Subsequently, after writing to a memory cell in this way, the electrical resistance state of the given memory cell can be determined (i.e., read) by applying a sensing current pulse to the material in order to determine its electrical resistance state. The amplitude of the sensing current pulse is preferably sufficiently smaller than the amplitude of the switching current pulse so that the electrical resistance state of the material is not altered by the read operation, and the written electrical resistance state persists.

Chalcogenides are one group of materials that have been proposed for use in nonvolatile memory cells because many materials within this group manifest two stable physical states having different electrical resistances. A. Pirovano et al., *Electronic Switching in Phase-Change Memories*, IEEE Transactions on Electron Devices, Vol. 51, No. 3, March 2004, for example, describes such a use of chalcogenides and is incorporated herein by reference. A chalcogenide typically comprises germanium, antimony, sulfur, selenium or tellurium, or a combination therof. When incorporated into a properly configured memory cell, a chalcogenide can be forced to transition between a higher electrical resistance amorphous state and a lower electrical resistance polycrystalline state by applying a switching current pulse. Importantly, the electrical resistance state into which a chalcogenide is placed is critically dependent on the amplitude of the applied switching current pulse rather than its direction.

Another group of materials displaying two stable electrical resistance states comprises transition metal oxides. The switching characteristics of memory cells comprising transition metal oxides are described in various publications, for example, A. Beck et al., *Reproducible Switching Effect in Thin Oxide Films for Memory Applications*, Applied Physics Letters, Vol. 77, No. 1, July 2000, and U.S. Pat. No. 6,815,744 to Beck et al., entitled "Microelectronic Device for Storing Information with Switchable Ohmic Resistance," both of which are also incorporated herein by reference. While the mechanism for the memory effect remains under study, the materials within this class, when incorporated into a properly configured memory cell reproducibly and reversibly undergo a transition from one stable electrical resistance state to a different stable electrical resistance state in response to an applied switching current pulse. However, unlike chalcogenides, the transition from one resistance state to the other in transition metal oxides is not critically dependent on the amplitude of the switching current pulse, but rather is dependent on its direction. In other words, a switching current pulse must have a particular direction of current flow in order to cause a transition metal oxide to transition between one electrical resistance state and its other electrical resistance state.

Notably, in the case of both chalcogenides and transition metal oxides, the ratio between the higher and lower electrical resistance states is typically between about 100:1 and 1,000:1. Moreover, the higher and lower electrical resistance states have been shown to persist for time periods on the order of months without being refreshed. Nevertheless, despite these apparent advantages, chalcogenides and transition metal oxides have heretofore only been utilized independently to form memory cells capable of storing a single bit of data at any given time. Because of strong demand for smaller, higher density memories, however, there is a need for nonvolatile memory cells capable of concurrently storing two or more bits of data.

SUMMARY OF THE INVENTION

The present invention sets forth novel memory cells for use in integrated circuits and methods for forming such memory cells. Advantageously, these memory cells are operative to concurrently store at least two bits of data.

In accordance with an aspect of the invention, a memory cell comprises a chalcogenide feature and a transition metal oxide feature. Both the chalcogenide feature and transition metal oxide feature each have at least two stable electrical resistance states. At least two bits of data can be concurrently stored in the memory cell by placing the chalcogenide feature into one of its stable electrical resistance states and by placing the transition metal oxide feature into one of its stable electrical resistance states.

In an illustrative embodiment, a nonvolatile two-bit memory cell comprises a chalcogenide feature and a transition metal oxide feature. The memory cell is configured such that the chalcogenide feature and the transition metal oxide feature are in electrical series with one another. The chalcogenide feature and transition metal oxide feature each have two stable electrical resistance states. Writing to the memory cell is accomplished by placing the chalcogenide feature into one of its stable electrical resistance states and by placing the transition metal oxide feature into one of its stable electrical resistance states. Advantageously, this writing operation can be accomplished by applying just a single pulse of switching current to the memory cell.

These and other features and advantages of the present invention will become apparent from the following detailed description which is to be read in conjunction with the accompanying figures.

DETAILED DESCRIPTION OF THE INVENTION

Figure 1:
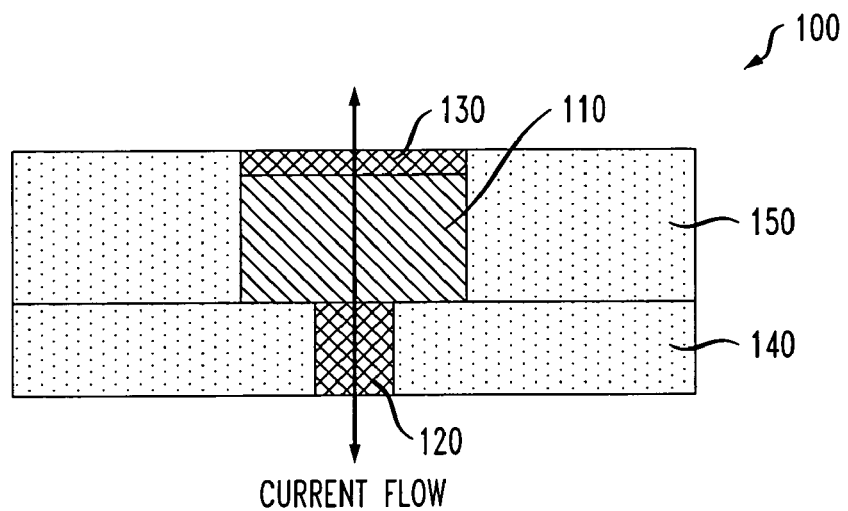
FIG. 1 shows a sectional view of a chalcogenide-based memory cell in accordance with aspects of the invention.

This invention will be illustrated herein in conjunction with exemplary memory cells for use in integrated circuits and methods for forming such memory cells. It should be understood, however, that the invention is not limited to the particular materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions. Moreover, details of the process steps used to fabricate such integrated circuit devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988, both of which are incorporated herein by reference.

The term "chalcogenide feature," as used herein, is intended to encompass any feature found in an integrated circuit formed of an alloy comprising germanium, antimony, sulfur, selenium or tellurium. A chalcogenide feature would, for example, encompass a feature comprising doped or undoped GeSb, SbTe and $Ge_2Sb_2Te_5$ (GST), as well as other materials. Moreover, the term "transition metal oxide feature," as used herein, is intended to encompass any feature found in an integrated circuit comprising a doped or undoped transition metal oxide. Accordingly, a transition metal oxide feature would, for example, encompass a feature comprising $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$ or $TiO_x$, as well as other materials.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. For example, those integrated circuit features associated with what it is commonly referred to as the front-end-of-line and middle-of-line are not described herein. This does not imply that the semiconductor layers and/or regions not explicitly shown are omitted from the actual integrated circuit.

A memory cell in accordance with an illustrative embodiment of the invention comprises both a chalcogenide feature and a transition metal oxide feature. However, it is important to recognize that this dual-material memory cell essentially comprises a chalcogenide-based memory cell portion and a transition metal oxide-based memory cell portion stacked together such that these portions are electrically connected in series with one another. Accordingly, solely for ease of understanding, the operation and characteristics of a chalcogenide-based memory cell will first be described, followed by a similar description of a separate transition metal oxide-based memory cell. It is anticipated that describing the characteristics and operation of the dual-material memory cell first in terms of these essential portions will aid one skilled in the art in understanding and applying aspects of the invention.

FIG. 1 shows a memory cell 100 comprising a chalcogenide feature 110, a heating element 120 and a first conductive barrier 130, all formed in first and second dielectric layers, 140 and 150, respectively. The chalcogenide feature preferably comprises GST while the heating element preferably comprises titanium nitride. The first and second dielectric layers preferably comprise silicon dioxide. The first conductive barrier is preferably operative to inhibit interdiffusion of materials between the chalcogenide feature and other features formed on the opposing side of the first conductive barrier while also facilitating good electrical contact with the chalcogenide feature. To achieve these purposes, the first conductive barrier preferably comprises titanium nitride.

Storing data in the chalcogenide-based memory cell 100 comprises placing the chalcogenide feature 110 into either a lower electrical resistance polycrystalline state or a higher electrical resistance amorphous state. Transitions between these electrical resistance states are accomplished by heating the chalcogenide feature by applying a pulse of switching current to the memory cell. The switching current pulse causes a large current density to form in the heating element 120 and the chalcogenide feature resulting in Joule heating. In response to this heating, an active region of the chalcogenide feature near the interface with the heating element either enters the amorphous or polycrystalline states. The duration of the switching current pulse is preferably between about one and about 500 nanoseconds with a fast falling edge (i.e., less than about 10 nanoseconds). The fast falling edge of the switching current pulse essentially freezes the chalcogenide feature in its current electrical resistance state without allowing additional time for bonds within the material to continue to rearrange.

Subsequently, reading the state of the chalcogenide-based memory cell 100 is accomplished by applying a pulse of sensing current to the memory cell. The sensing current pulse is preferably of low enough amplitude to provide negligible Joule heating in the heating element 120 and the chalcogenide feature 110. Accordingly, the electrical resistance state of the chalcogenide feature can be determined in this manner without disturbing its written electrical resistance state. Data integrity is thereby maintained while reading the data.

Figure 2:
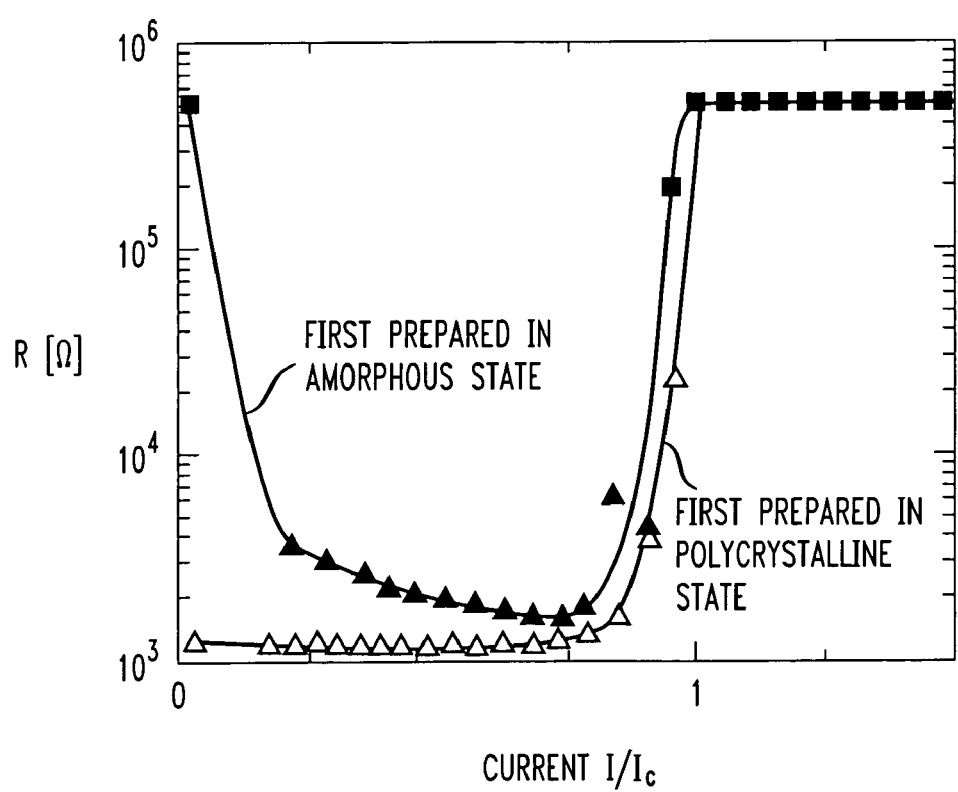
FIG. 2 shows a graph of memory cell electrical resistance versus applied switching current pulse amplitude for the FIG. 1 memory cell.

The operation of a chalcogenide-based memory cell similar to the memory cell 100 is further detailed in FIG. 2. FIG. 2 shows a graph of memory cell electrical resistance versus applied switching current pulse amplitude, I, for a pulse width of about 150 nanoseconds. Two sets of data are shown, one set of data showing the response of the memory cell when the chalcogenide feature was first prepared in its amorphous state before the application of the switching current pulse, and another set of data showing the response of the memory cell when the chalcogenide feature was first prepared in its polycrystalline state before applying the switching current pulse. In both sets of data, applying a switching current pulse with an amplitude equal to or greater than a critical amplitude level for the chalcogenide feature, $I \geq I_C$, places the chalcogenide feature into its higher electrical resistance amorphous state. Subsequently, the memory cell displays an electrical resistance of about $5 \times 10^5$ ohms. In contrast, applying a switching current pulse of the same duration with an amplitude equal to about half of $I_C$, $I \approx I_C/2$, places the chalcogenide feature in its lower electrical resistance polycrystalline state. In this configuration, the memory cell exhibits an electrical resistance of about $1 \times 10^3$ ohms. Notably, the data shown in FIG. 2 can be reproduced by applying the switching current pulse with any arbitrary mix of switching current pulse directions.

Figure 3:
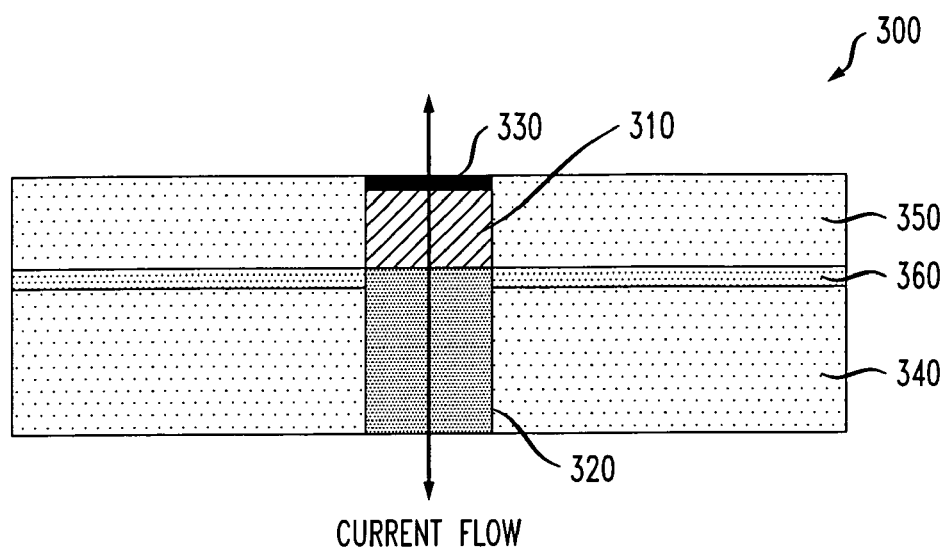
FIG. 3 shows a sectional view of a transition metal oxide-based memory cell in accordance with aspects of the invention.

FIG. 3, in contrast, shows a transition metal oxide-based memory cell 300 comprising a transition metal oxide feature 310, an electrode 320 and a second conductive barrier 330, all formed in third and forth dielectric layers, 340 and 350, respectively, and a nitride layer 360. The transition metal oxide feature preferably comprises chromium-doped $SrTiO_3$. The electrode preferably comprises copper or platinum. The third and forth dielectric layers preferably comprise silicon dioxide. The second conductive barrier is preferably operative to inhibit interdiffusion of materials between the transition metal oxide feature and other features formed on the opposing side of the second conductive barrier while also facilitating good electrical contact with the transition metal oxide feature. The second conductive barrier preferably comprises platinum.

As in the case of the chalcogenide-based memory cell 100, storing data the transition metal oxide-based memory cell 300 comprises placing the transition metal oxide feature 310 into either a lower electrical resistance state or a higher electrical resistance state by applying a switching current pulse. As before, the duration of the switching current pulse is preferably between about one and about 500 nanoseconds with a fast falling edge (i.e., less than 10 nanoseconds). Also, like the chalcogenide-based memory cell, subsequently reading the state of the transition metal oxide-based memory cell is accomplished by applying a sensing current pulse to the memory cell of low enough amplitude to not disturb the transition metal oxide feature's programmed electrical resistance state.

Figure 4:
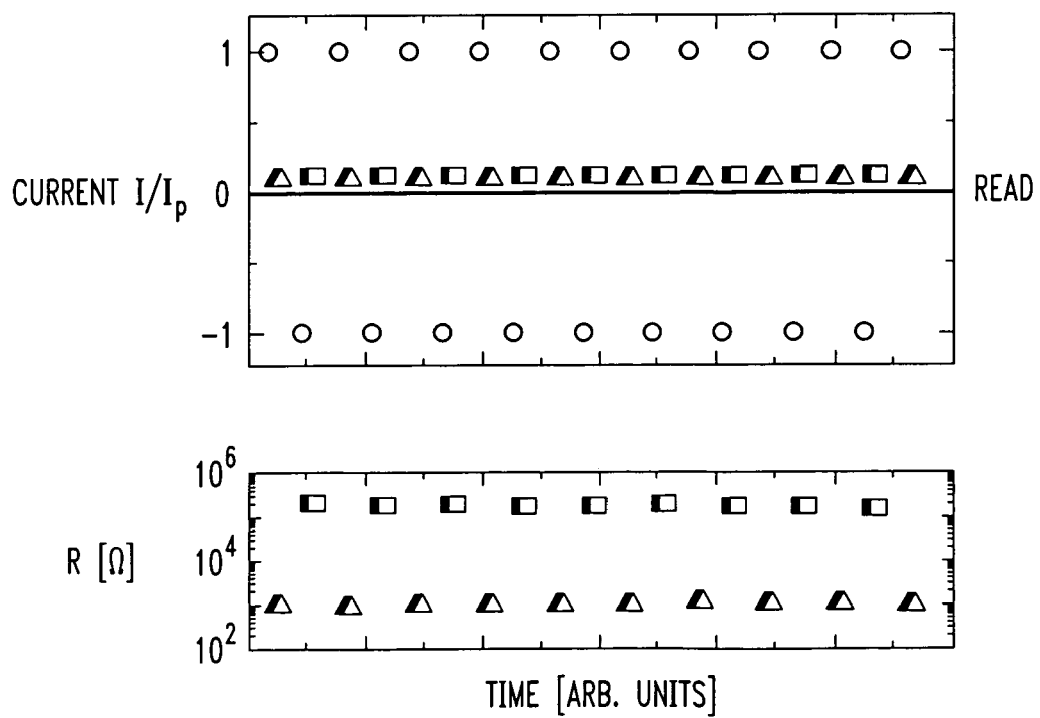
FIG. 4 shows graphs of applied current pulse amplitude and memory cell electrical resistance versus time for the FIG. 3 memory cell.

Importantly, it is the direction of the switching current pulse in the transition metal oxide-based memory cell 300, rather than its amplitude that determines the electrical resistance state into which the transition metal oxide feature 310 is placed. FIG. 4 helps to show these dynamics. FIG. 4 shows the effect of the application of sequential current pulses of varying amplitude and direction, I, to a memory cell similar to the transition metal oxide-based memory cell shown in FIG. 3. First a switching current pulse of an amplitude and direction sufficient to cause the transition metal oxide feature to enter its lower electrical resistance state, $I=+I_P$, is applied to the memory cell. Next, a low amplitude sensing current is applied and the electrical resistance state of the memory cell is determined. With the transition metal oxide feature in its lower electrical resistance state, the memory cell exhibits an electrical resistance of about $1\times10^3$ ohms. Subsequently, a switching current pulse of an amplitude and direction sufficient to cause the transition metal oxide feature to enter it higher electrical resistance state, $I=-I_P$, is applied to the memory cell. Finally, another low amplitude sensing current pulse is applied to the memory cell to determine the resistance of the memory cell. Here, with the transition metal oxide feature in its higher electrical resistance state, the memory cell exhibits an electrical resistance of about $2\times10^5$ ohms.

$I_C$ for a chalcogenide-based memory cell like the memory cell 100 in FIG. 1 will typically be about 100 microamperes. However, $I_C$ is strongly dependent on the contact size between the chalcogenide feature 110 and the heating element 120. Accordingly, $I_C$ may be modified upward or downward by, for example, modifying this contact size by changing the dimensions of the heating element. $I_P$ for a transition metal oxide-based memory cell like the memory cell 300 in FIG. 3, in comparison, is typically substantially smaller than $I_C$. Moreover, $I_P$ can also be modified upward or downward by simply modifying the volume of the transition metal oxide feature 310.

Figure 5:
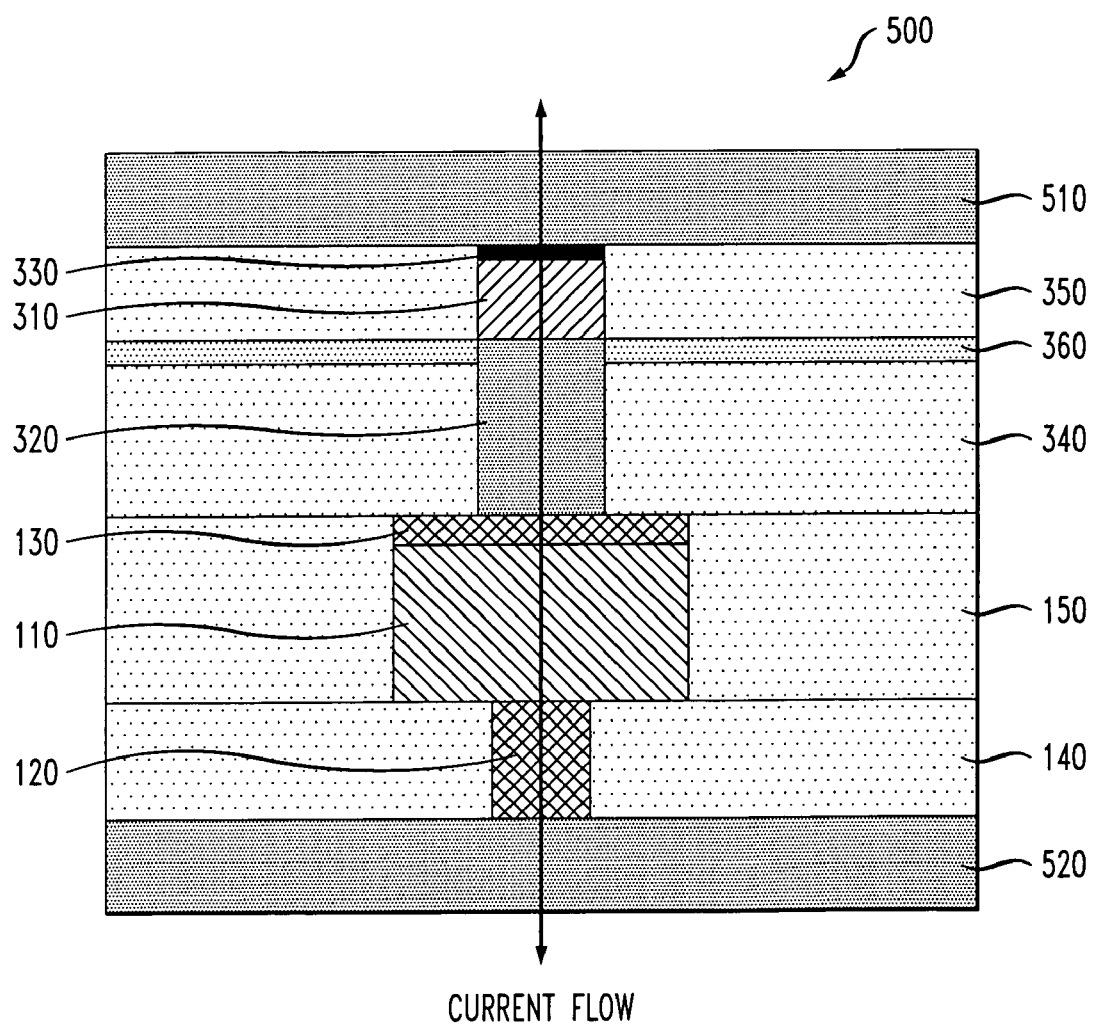
FIG. 5 shows a sectional view of a memory cell comprising a chalcogenide feature and transition metal oxide feature in accordance with an illustrative embodiment of the invention.

It is the unique switching characteristics of chalcogenides and transition metal oxides described with reference to FIGS. 2 and 4 that allow both groups of materials to be combined to form novel nonvolatile memory cells for use in integrated circuits. FIG. 5 shows a memory cell 500 comprising a chalcogenide feature and a transition metal oxide feature in accordance with an illustrative embodiment of the invention. The dual-material memory cell in this embodiment is created simply by forming a transition metal oxide-based memory cell like the memory cell 300 shown in FIG. 3 on top of a chalcogenide-based memory cell like the memory cell 100 shown in FIG. 1. Accordingly, for ease of understanding, the elements forming the dual-material memory cell in FIG. 5 are labeled with the same reference numerals as those used in FIGS. 1 and 3. Top and bottom metallization, 510 and 520, respectively, allow the memory cell to be electrically connected to other devices in the integrated circuit. In accordance with an aspect of the invention, the chalcogenide feature 110 and transition metal oxide feature 310 are in electrical series with one another.

To achieve the most advantageous functioning of the dual-material memory cell 500 shown in FIG. 5, $I_C$ and $I_P$ are preferably configured such that $I_P$ is equal to or less than about $I_C/2$. With this configuration, writing to the dual-material memory cell can be performed as follows:

1) To place the chalcogenide feature 110 in its lower electrical resistance state and to place the transition metal oxide feature 310 in its lower electrical resistance state ("low+low memory state"), a switching current with amplitude and direction $I=+I_C/2$ is applied for a time t.
2) To place the chalcogenide feature in its lower electrical resistance state and to place the transition metal oxide feature in its higher electrical resistance state ("low+high memory state"), a switching current with amplitude and direction $I=-I_C/2$ is applied for a time t.
3) To place the chalcogenide feature in its higher electrical resistance state and to place the transition metal oxide feature in its lower electrical resistance state ("high+low memory state"), a switching current with amplitude and direction $I=+I_C$ is applied for a time t.
4) To place the chalcogenide feature in its higher electrical resistance state and to place the transition metal oxide feature in its higher electrical resistance state ("high+high memory state"), a switching current with amplitude and direction $I=-I_C$ is applied for a time t.

Thus, in accordance with an aspect of the invention, two bits of data can be written to the dual-material memory cell by applying only a single pulse of electrical current to the memory cell in a given direction.

Reading the dual-material memory cell 500 is accomplished, as before, by applying a sensing current pulse of an amplitude insufficient to affect the programmed states of the chalcogenide and transition metal oxide features 110, 310. The electrical resistance state is preferably determined by sensing circuitry that is electrically connected to the top and bottom metallization, 510, 520. This type of sensing circuitry is conventionally used in integrated circuits and, accordingly, its design and operation will be familiar to one skilled in the art. If the electrical resistance states of the chalcogenide and transition metal oxide features have electrical resistance values equal to those shown in FIGS. 2 and 4, for example, the dual-material memory cell in its low+low memory state would exhibit an electrical resistance of about $2\times10^3$ ohms. The dual-material memory cell in its low+high and high+low memory states would exhibit electrical resistances of about $5\times10^5$ ohms and about $2\times10^5$ ohms, respectively. Finally, the dual-material memory cell in its high+high memory state would exhibit an electrical resistance of about $7\times10^5$ ohms.

While one skilled in the art will recognize that these particular electrical resistance values are easily distinguishable by conventional sensing circuitry in modern integrated circuits, it should also be noted that the electrical resistance values of the chalcogenide and transition metal oxide features 110, 310 shown in FIGS. 2 and 4 are merely illustrative and can be easily modified by, for example, changing the volume of these features. Moreover, the electrical resistance of the chalcogenide feature in its various electrical resistance states can be tuned over several orders of magnitude by doping this material with, for instance, nitrogen, oxygen, silicon, indium or silver during the formation of the chalcogenide feature. Likewise, the electrical resistance of the transition metal oxide feature in its various electrical resistance states can be tuned, for example, by doping the transition metal oxide with varying concentrations of chromium, manganese or vanadium, or a combination thereof, or by choosing a different transition metal oxide material altogether. It is therefore possible to easily achieve substantially greater electrical resistance differentials between the various memory states of the dual-material memory cell 500 than those illustrated herein.

Figure 6A:
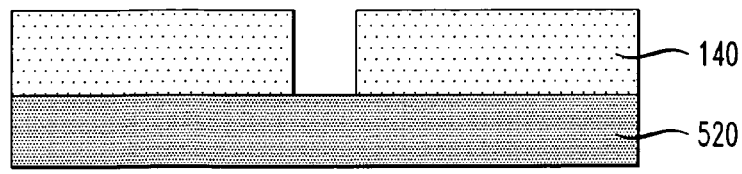
FIGS. 6A-6D show sectional views of the portion of the FIG. 5 memory cell comprising the chalcogenide feature during various stages of formation.
Figure 6B:
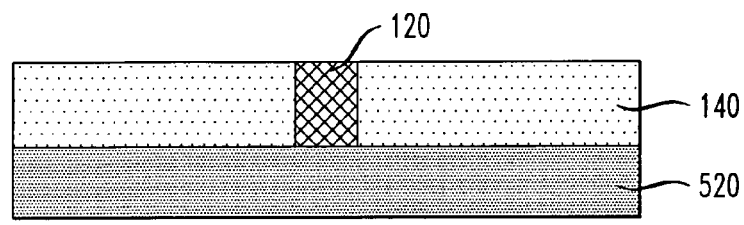
Figure 6C:
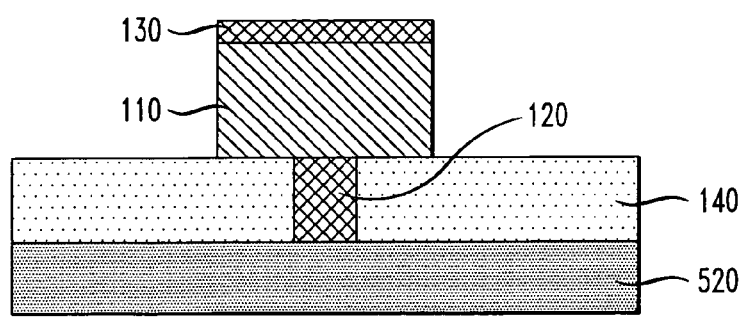
Figure 6D:
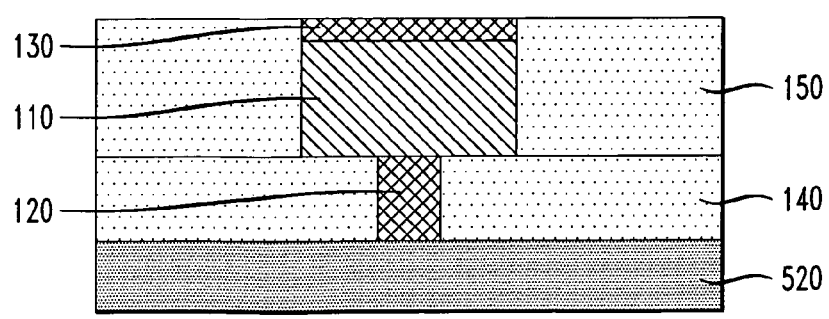

Advantageously, formation of the dual-material memory cell 500 shown in FIG. 5 is achieved in large part by a sequence of conventional semiconductor processing steps. FIGS. 6A-6D show the preferred process sequence for forming the portion of the dual-material memory cell comprising the chalcogenide feature 110. After forming the bottom metallization 520, the first dielectric layer 140 is deposited, preferably by chemical vapor deposition (CVD), on the bottom metallization. Subsequently, the first dielectric layer is patterned by conventional photolithography and reactive ion etching (RIE) so that it contains a trench feature in the shape of the intended heating element 120. The resultant film stack is shown in FIG. 6A. Next, a layer of heating element material is deposited conformally, preferably by sputtering, onto the patterned first dielectric layer. Chemical mechanical polishing (CMP) is used to remove the excess heating element material from the top surface of the first dielectric layer, resulting in the film stack shown in FIG. 6B.

To form the chalcogenide feature 110 and the first conductive barrier 130, a layer of chalcogenide material and a layer of first conductive barrier material are sequentially deposited on top of the first dielectric layer 140 and the heating element 120. Deposition of the layer of chalcogenide material and the layer of first conductive barrier material are preferably by sputtering. These layers are then patterned by conventional photolithography and RIE to form the discrete chalcogenide feature and the first conductive barrier shown in FIG. 6C. Subsequently, the second dielectric layer 150 is conformally deposited, preferably by CVD, onto the film stack shown in FIG. 6C. Removing the excess second dielectric layer from the top of the first conductive barrier by CMP results in the film stack shown in FIG. 6D.

Figure 7A:
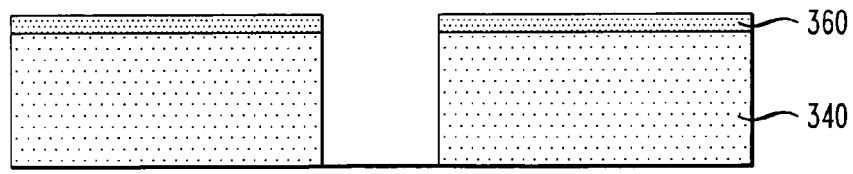
FIGS. 7A-7D show sectional views of the portion of the FIG. 5 memory cell comprising the transition metal oxide feature during various stages of formation.
Figure 7B:
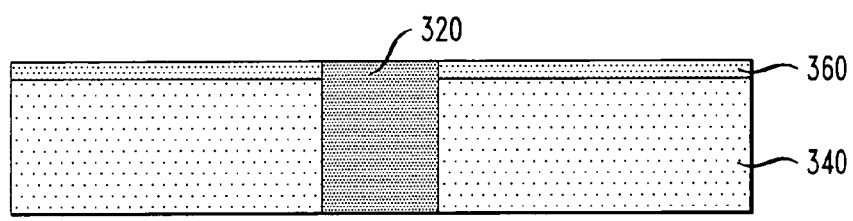
Figure 7C:
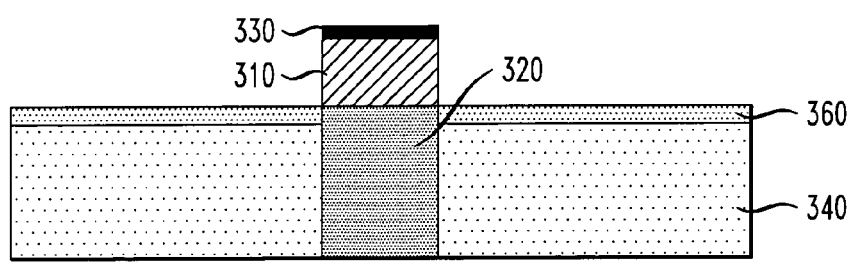
Figure 7D:
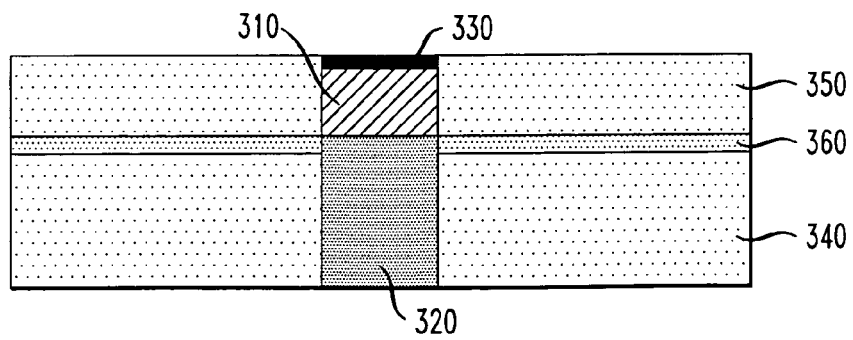

After forming the portion of memory cell comprising the chalcogenide feature 110, the remainder of the dual-material memory cell 500 is preferably formed by following the steps shown in FIGS. 7A-7D. First the third dielectric layer 340 and nitride layer 360 are deposited, preferably by CVD. Next these layers are patterned by conventional photolithography and RIE to form a trench feature in the shape of the intended electrode 320. The resultant film stack is shown in FIG. 7A. Next a layer of electrode material is deposited conformally onto the patterned third dielectric layer and nitride layer, preferably by electroplating. CMP is then used to remove the excess electrode material from the top surface of the nitride layer, resulting in the film stack shown in FIG. 7B.

Formation of the transition metal oxide feature 310 and second conductive barrier 330 is achieved by sequentially depositing a layer of transition metal oxide material and layer of second conductive barrier material on the nitride layer 360. Deposition of the layer of transition metal oxide material is preferably by sputtering or CVD, while deposition of the layer of second conductive barrier material is preferably by sputtering. These layers are then patterned by convention photolithography and RIE to form the discrete transition metal oxide feature and the second conductive barrier shown in FIG. 7C. Subsequently, the fourth dielectric layer 350 is conformally deposited, preferably by CVD, onto the film stack shown in FIG. 7C. Removing the excess fourth dielectric layer from the top of the second conductive barrier by CMP results in the film stack shown in FIG. 7D. Forming the top metallization 510 on the film stack shown in FIG. 7D results in the dual-material memory cell 500 shown in FIG. 5.

The processes described herein may be implemented to form an integrated circuit. In forming integrated circuits, a plurality of identical die is typically fabricated in a repeated pattern on a surface of a semiconductor wafer. Each die includes a memory cell formed by the methods falling within the scope of the invention set forth herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A memory cell comprising:
   a chalcogenide feature having at least two stable electrical resistance states; and
   a transition metal oxide feature having at least two stable electrical resistance states, the transition metal oxide feature being in direct electrical connection with the chalcogenide feature;
   wherein the chalcogenide feature and the transition metal oxide feature are configured relative to one another so as to concurrently store at least two bits of data in the memory cell by placing the chalcogenide feature into one of the at least two stable electrical resistance states of the chalcogenide feature and by placing the transition metal oxide feature into one of the at least two stable electrical resistance states of the transition metal oxide feature;
   wherein the transition metal oxide feature is doped with chromium, manganese or vanadium.

2. The memory cell of claim 1, wherein the chalcogenide feature and the transition metal oxide feature are in electrical series with one another.

3. The memory cell of claim 1, wherein the chalcogenide feature and the transition metal oxide feature are configured such that the at least two bits of data are concurrently stored in the memory cell by applying a single pulse of electrical current to the memory cell in a given direction.

4. The memory cell of claim 3, wherein the duration of the single pulse of electrical current is between about one nanosecond and about 500 nanoseconds.

5. The memory cell of claim 3, wherein the amplitude of the single pulse of electrical current is between about one microampere and about 200 microamperes.

6. The memory cell of claim 3, wherein the chalcogenide feature is configured such that the stable electrical resistance state into which the chalcogenide feature is placed is independent of the direction of the single pulse of electrical current.

7. The memory cell of claim 3, wherein the transition metal oxide feature is configured such that the stable electrical resistance state into which the transition metal oxide feature is placed is dependent on the direction of the single pulse of electrical current.

8. The memory cell of claim 3, wherein the chalcogenide feature and the transition metal oxide feature are configured such that the at least two bits of data are read from the memory cell by applying a single pulse of electrical current to the memory cell.

9. The memory cell of claim 1, wherein the chalcogenide feature comprises germanium, antimony, sulfur, selenium or tellurium, or a combination thereof.

10. The memory cell of claim 1, wherein the chalcogenide feature is doped with nitrogen, oxygen, silicon, indium or silver, or a combination thereof.

11. The memory cell of claim 1, wherein the transition metal oxide feature comprises titanium, vanadium, chromium, manganese, nickel, zirconium, niobium, hafnium or tantalum, or a combination thereof.

12. The memory cell of claim 1, wherein the chalcogenide feature is chemically doped so as to tune an electrical resistance of at least one of the stable electrical resistance states of the chalcogenide feature.

13. The memory cell of claim 1, wherein the transition metal oxide feature is chemically doped so as to tune an electrical resistance of at least one of the stable electrical resistance states the transition metal oxide feature.

14. The memory cell of claim 1, wherein data stored in the memory cell is nonvolatile.

15. An integrated circuit comprising one or more memory cells, at least one of the one or more memory cells comprising:
    a chalcogenide feature having at least two stable electrical resistance states; and
    a transition metal oxide feature having at least two stable electrical resistance states, the transition metal oxide feature being in direct electrical connection with the chalcogenide feature;
    wherein the chalcogenide feature and the transition metal oxide feature are configured relative to one another so as to concurrently store at least two bits of data in the memory cell by placing the chalcogenide feature into one of the at least two stable electrical resistance states of the chalcogenide feature and by placing the transition metal oxide feature into one of the at least two stable electrical resistance states of the transition metal oxide feature;
    wherein the transition metal oxide feature is doped with chromium, manganese or vanadium.

16. The integrated circuit of claim 15, wherein the integrated circuit comprises a random access memory.

17. The integrated circuit of claim 15, wherein the integrated circuit comprises a nonvolatile memory.

* * * * *